US012610639B2

(12) United States Patent

Hung

(10) Patent No.: US 12,610,639 B2

(45) Date of Patent: Apr. 21, 2026

(54) SEMICONDUCTOR PACKAGE STRUCTURE AND METHOD FOR PRODUCING THE SAME

(71) Applicant: TONG HSING ELECTRONIC INDUSTRIES, LTD., Taipei City (TW)

(72) Inventor: Li-Chun Hung, Hsin-Chu County (TW)

(73) Assignee: TONG HSING ELECTRONIC INDUSTRIES, LTD., Taipei City (TW)

( * ) Notice: Subject to any disclaimer, the term of this patent is extended or adjusted under 35 U.S.C. 154(b) by 439 days.

(21) Appl. No.: 18/500,092

(22) Filed: Nov. 1, 2023

(65) Prior Publication Data

US 2025/0048761 A1 Feb. 6, 2025

(30) Foreign Application Priority Data

Aug. 1, 2023 (TW) ................................. 112128752

(51) Int. Cl.
H10F 39/00 (2025.01)

(52) U.S. Cl.
CPC ......... H10F 39/804 (2025.01); H10F 39/024 (2025.01); H10F 39/806 (2025.01); H10F 39/811 (2025.01)

(58) Field of Classification Search
CPC .... H10F 39/804; H10F 39/024; H10F 39/806; H10F 39/811
See application file for complete search history.

(56) References Cited

U.S. PATENT DOCUMENTS

| | | | | |
|---|---|---|---|---|
| 5,709,960 | A * | 1/1998 | Mays ................... | H10W 40/257 257/789 |
| 11,075,131 | B2 | 7/2021 | Tsai et al. | |
| 2003/0201535 | A1* | 10/2003 | Chen ................... | H10W 76/153 257/784 |
| 2017/0221952 | A1* | 8/2017 | Huang ................ | H10F 39/8063 |
| 2018/0061767 | A1* | 3/2018 | Chiang ............... | H10W 70/614 |
| 2019/0019834 | A1* | 1/2019 | Tu ......................... | H10F 39/811 |
| 2019/0057992 | A1* | 2/2019 | Chen ..................... | H10F 39/804 |
| 2019/0355639 | A1* | 11/2019 | Chen ..................... | H10F 39/804 |
| 2019/0393113 | A1* | 12/2019 | Chen ...................... | H10F 39/804 |
| 2019/0393254 | A1* | 12/2019 | Chen ..................... | H10F 39/804 |

(Continued)

*Primary Examiner* — S M Sohel Imtiaz

(74) *Attorney, Agent, or Firm* — Li & Cai Intellectual Property Office

(57) ABSTRACT

A semiconductor package structure and a method for producing the same are provided. The package structure includes a support substrate, a chip body disposed on the support substrate, a metal lead connected between the support substrate and the chip body, a spacer element disposed on the chip body, and a light-transmitting plate disposed on the chip body through the spacer element. The chip body, the spacer element, and the light-transmitting plate jointly define a closed space. The package structure further includes an encapsulation colloid formed on outsides of the closed space. The encapsulation colloid is formed by curing a liquid resin encapsulant and includes a plurality of first fillers and a plurality of second fillers dispersed therein. Before the liquid resin encapsulant is cured, a sinking rate of each of the second fillers in the liquid resin encapsulant is less than that of each of the first fillers.

10 Claims, 13 Drawing Sheets

(56)     References Cited

U.S. PATENT DOCUMENTS

| | | | |
|---|---|---|---|
| 2020/0294964 A1* | 9/2020 | Min | H10W 74/121 |
| 2021/0050273 A1* | 2/2021 | Hsieh | H10W 74/014 |
| 2021/0074754 A1* | 3/2021 | Jang | H10F 39/804 |
| 2021/0134711 A1* | 5/2021 | Fang | H10W 74/473 |
| 2022/0115426 A1* | 4/2022 | Son | H10F 39/804 |
| 2023/0369363 A1* | 11/2023 | Wu | H10F 39/804 |
| 2024/0379481 A1* | 11/2024 | Lee | H10W 70/65 |

* cited by examiner

SEMICONDUCTOR PACKAGE STRUCTURE AND METHOD FOR PRODUCING THE SAME

CROSS-REFERENCE TO RELATED PATENT APPLICATION

This application claims the benefit of priority to Taiwan Patent Application No. 112128752, filed on Aug. 1, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a semiconductor package structure and a method for producing the same.

BACKGROUND OF THE DISCLOSURE

As shown in FIG. 1 to FIG. 3, in the related art, a chip R1, gold wires R2, and a glass R3 in a CIS package can be protected through being surrounded by a liquid resin encapsulant R4 to prevent these components from being damaged during reliability testing or transportation, thereby avoiding functional failure of a product.

However, during a curing process for the liquid resin encapsulant R4 of the CIS package, a viscosity of the liquid resin encapsulant R4 changes along with changes in temperature. Accordingly, fillers FP originally added in the liquid resin encapsulant R4 may sink downward due to the viscosity of the liquid resin encapsulant R4 becoming low and a gravity sedimentation of the fillers, or due to a long resting time. Therefore, after the liquid resin encapsulant R4 is cured, the fillers FP may partially separate from a top portion of the encapsulant R4 located at a junction of the highest point of the glass R3 and the encapsulant R4, and this phenomenon can be referred to as filler segregation, as illustrated in FIG. 2. As a result, there is no distribution of the fillers FP at the junction of the highest point of the glass R3 and the encapsulant R4.

The above-mentioned phenomenon of filler segregation can easily cause cracks C on the glass R3 of the CIS package during a reliability test (e.g., a temperature cycle reliability test), thereby causing the finished product to fail the reliability test, as shown in FIG. 3.

SUMMARY OF THE DISCLOSURE

In response to the above-referenced technical inadequacies, the present disclosure provides a semiconductor package structure and a method for producing the same, which can effectively improve the phenomenon of filler separation to avoid cracking of glass.

In order to solve the above-mentioned problems, one of the technical aspects adopted by the present disclosure is to provide a semiconductor package structure including a support substrate, a chip body, a metal lead, a spacer element, a light-transmitting plate, and an encapsulation colloid. The chip body is disposed on a side surface of the support substrate. The metal lead is connected between the support substrate and the chip body. The spacer element is disposed on a side surface of the chip body. The light-transmitting plate is disposed on the chip body through the spacer element. The chip body, the spacer element, and the light-transmitting plate jointly define a closed space. The encapsulation colloid is formed on the support substrate to cover outsides of the chip body, the spacer element, and the light-transmitting plate relative to the closed space, and to cover the metal lead. The encapsulation colloid is formed by curing a liquid resin encapsulant. The encapsulation colloid includes a plurality of first fillers and a plurality of second fillers dispersed therein. Material properties of the plurality of first fillers and the plurality of second fillers meet the following conditions. Before the liquid resin encapsulant is cured, a sinking rate of each of the first fillers in the liquid resin encapsulant is defined as a first sinking rate, a sinking rate of each of the second fillers in the liquid resin encapsulant is defined as a second sinking rate, and the second sinking rate is less than the first sinking rate.

In order to solve the above-mentioned problems, another one of the technical aspects adopted by the present disclosure is to provide a method for producing a semiconductor package structure, including: providing a support substrate; disposing a chip body on a side surface of the support substrate; connecting a metal lead between the support substrate and the chip body; disposing a spacer element on a side surface of the chip body; disposing a light-transmitting plate on the chip body through the spacer element, in which the chip body, the spacer element, and the light-transmitting plate jointly define a closed space; and forming an encapsulation colloid on the support substrate to cover outsides of the chip body, the spacer element, and the light-transmitting plate relative to the closed space, in which the encapsulation colloid covers the metal lead.

Moreover, the encapsulation colloid is formed by curing a liquid resin encapsulant, and the encapsulation colloid includes a plurality of first fillers and a plurality of second fillers dispersed therein. Material properties of the plurality of first fillers and the plurality of second fillers meet the following conditions. Before the liquid resin encapsulant is cured, a sinking rate of each of the first fillers in the liquid resin encapsulant is defined as a first sinking rate, a sinking rate of each of the second fillers in the liquid resin encapsulant is defined as a second sinking rate, and the second sinking rate is less than the first sinking rate.

Therefore, in the semiconductor package structure and the method for producing the same provided by the present disclosure, through the design of material properties of the first fillers and the second fillers in the encapsulation colloid, the distribution of the first fillers and the second fillers in the encapsulation colloid can be effectively improved, and glass cracks caused by the filler separation can be effectively avoided.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

3

4

Figure 1:
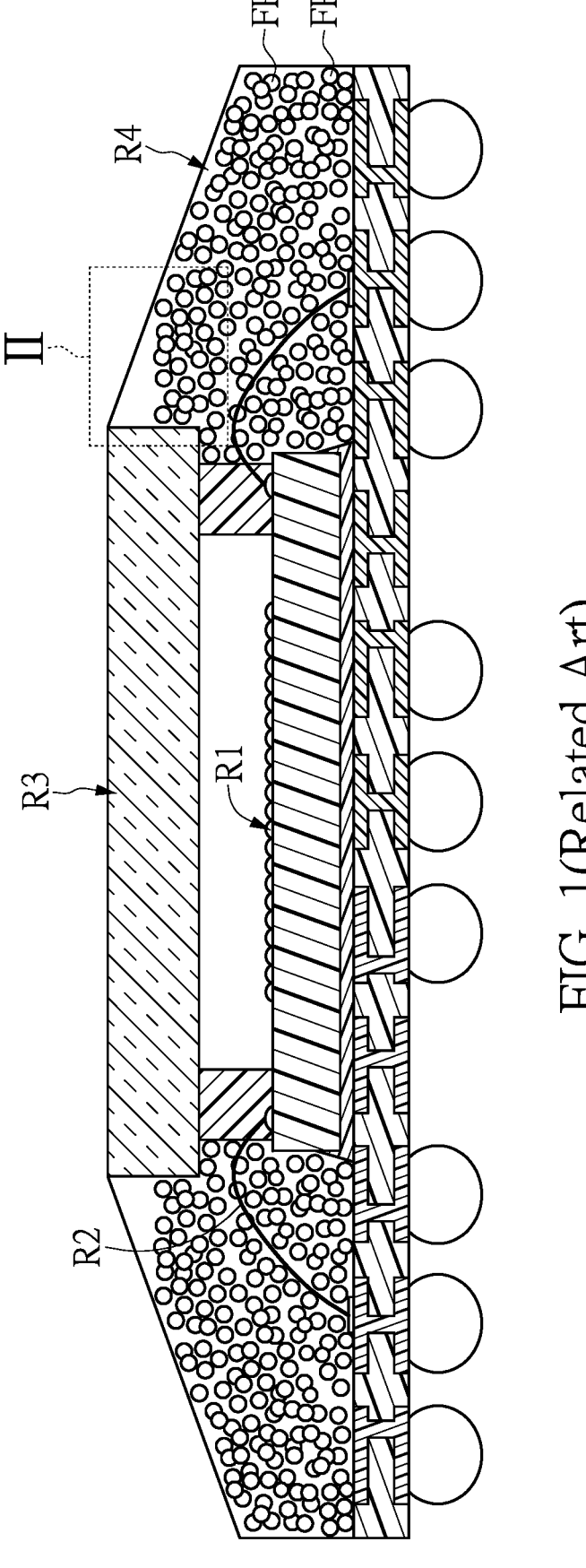
Figure 2:
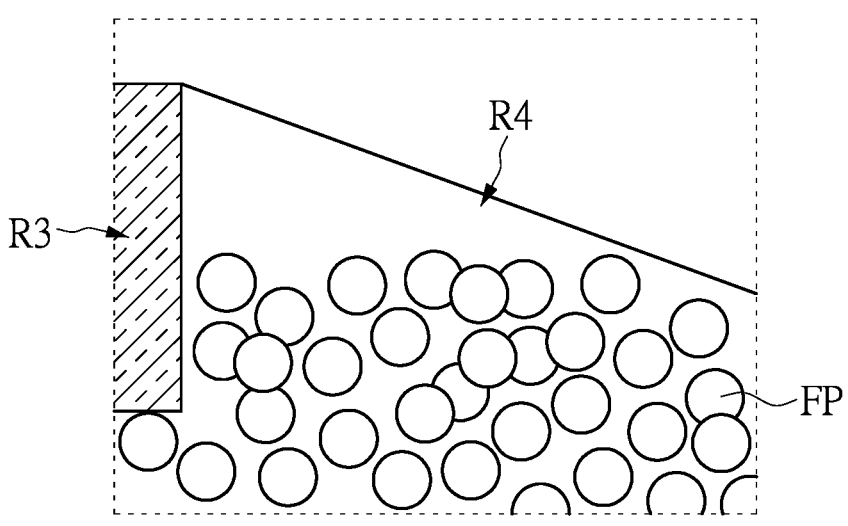
Figure 3:
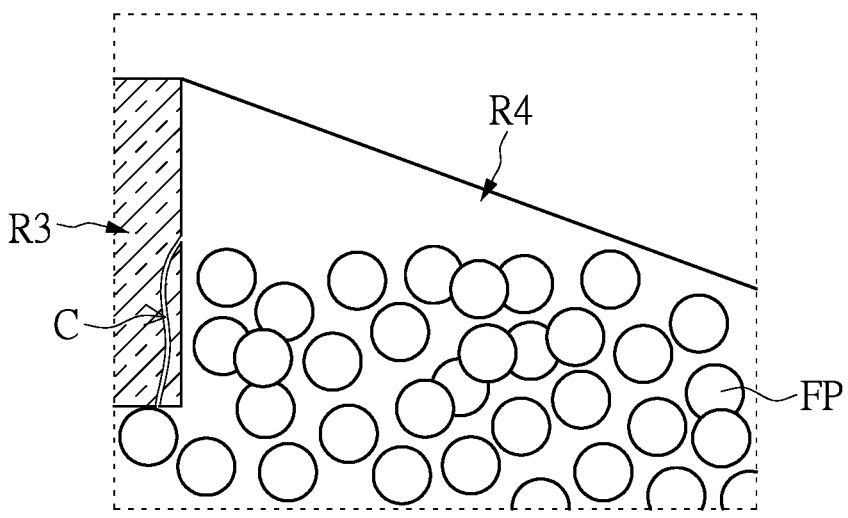
Figure 4:
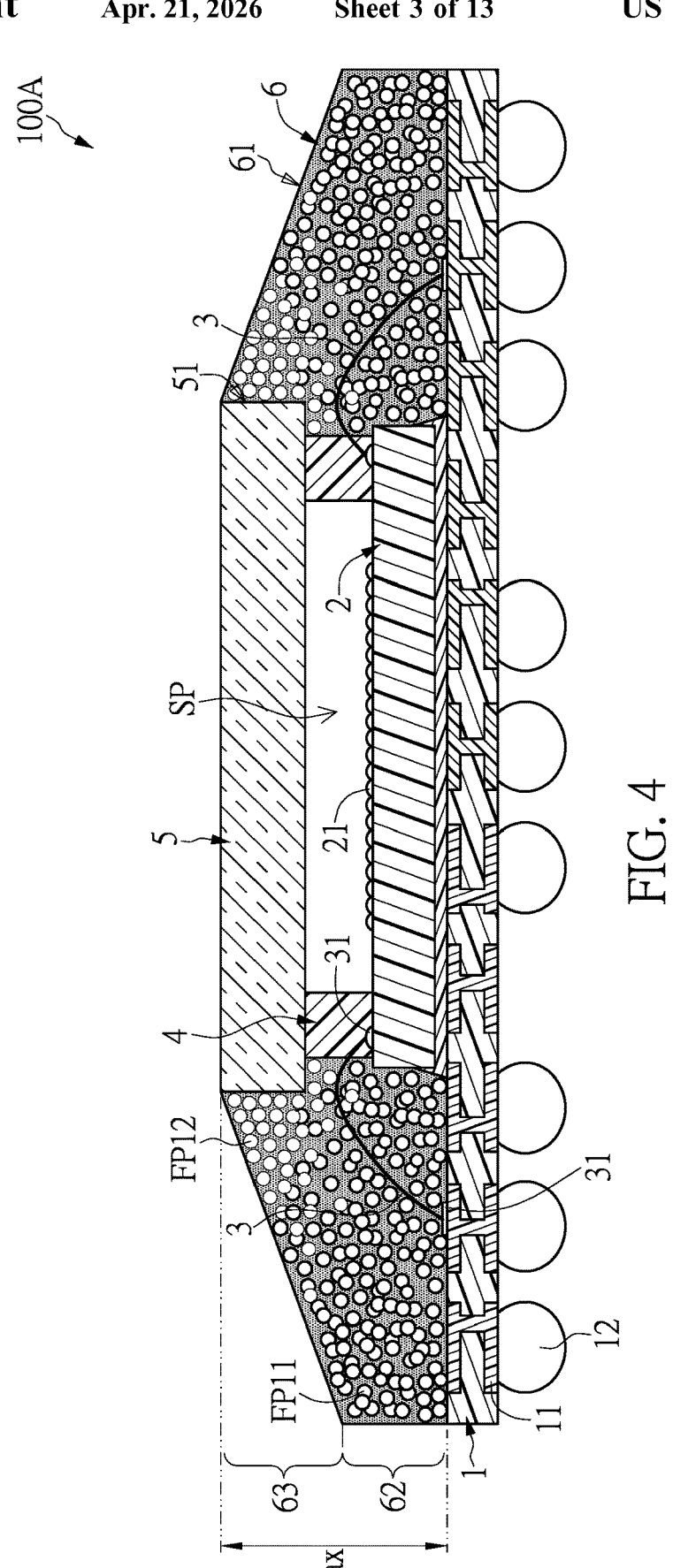
Figure 5:
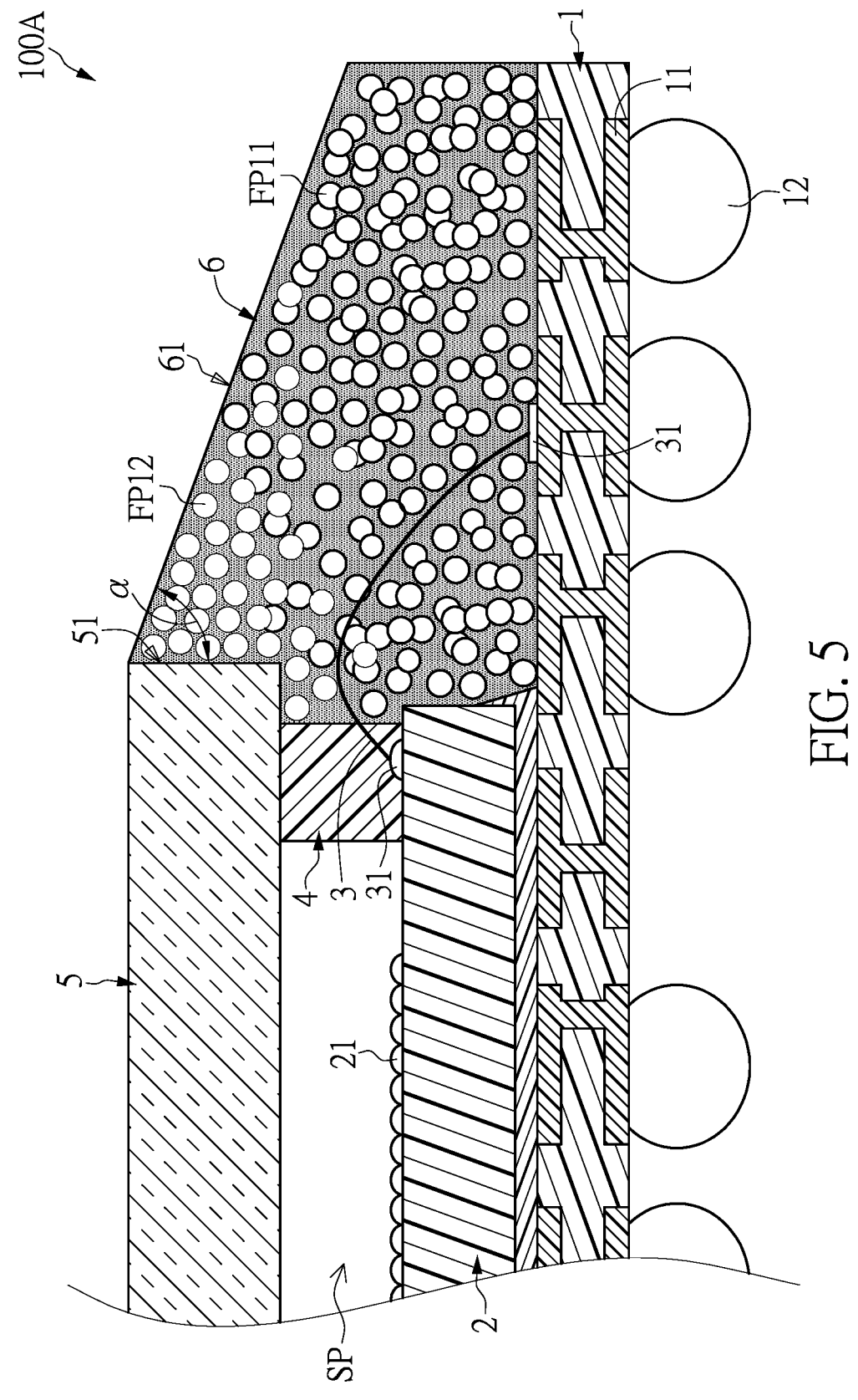
Figure 6:
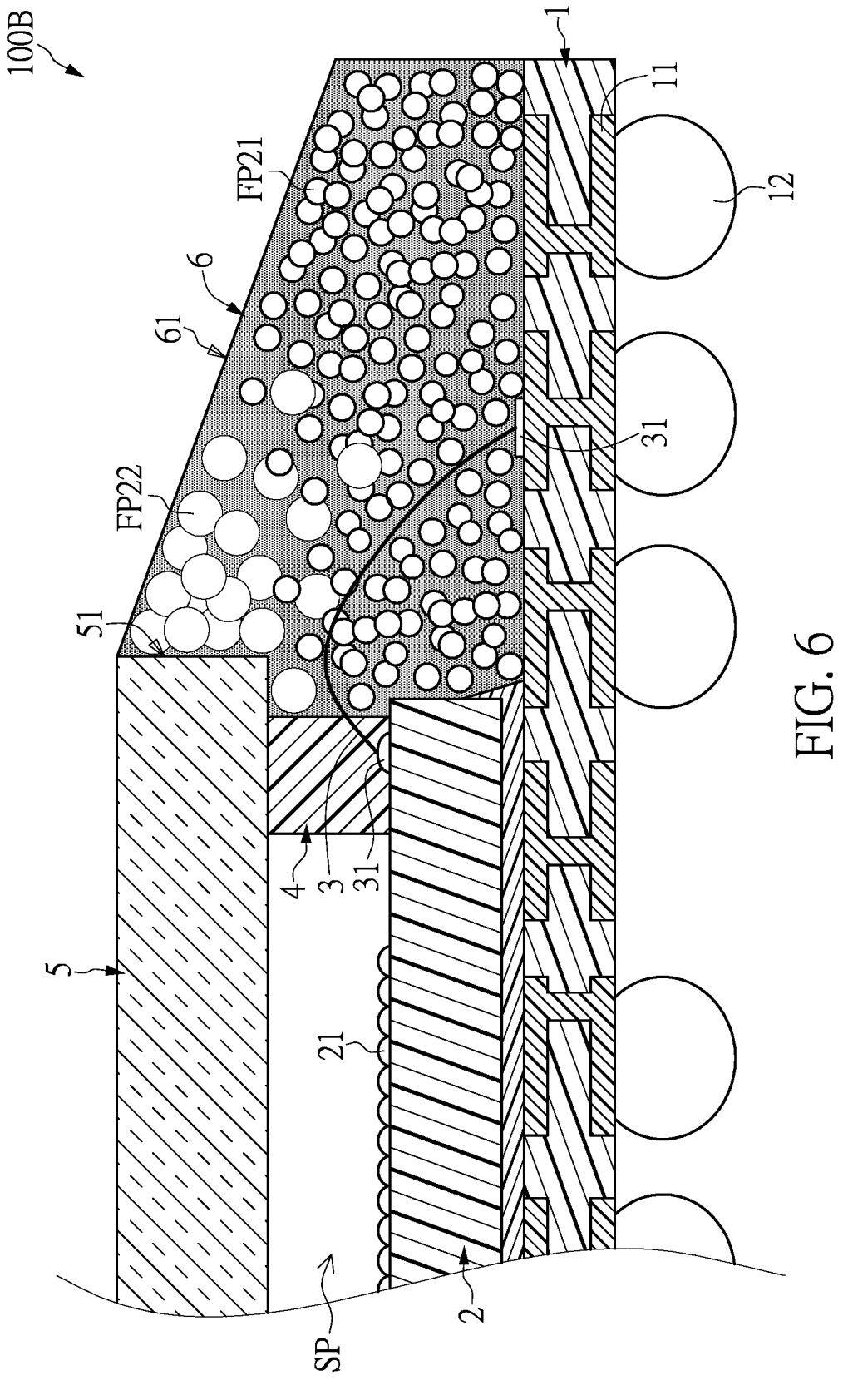
Figure 7:
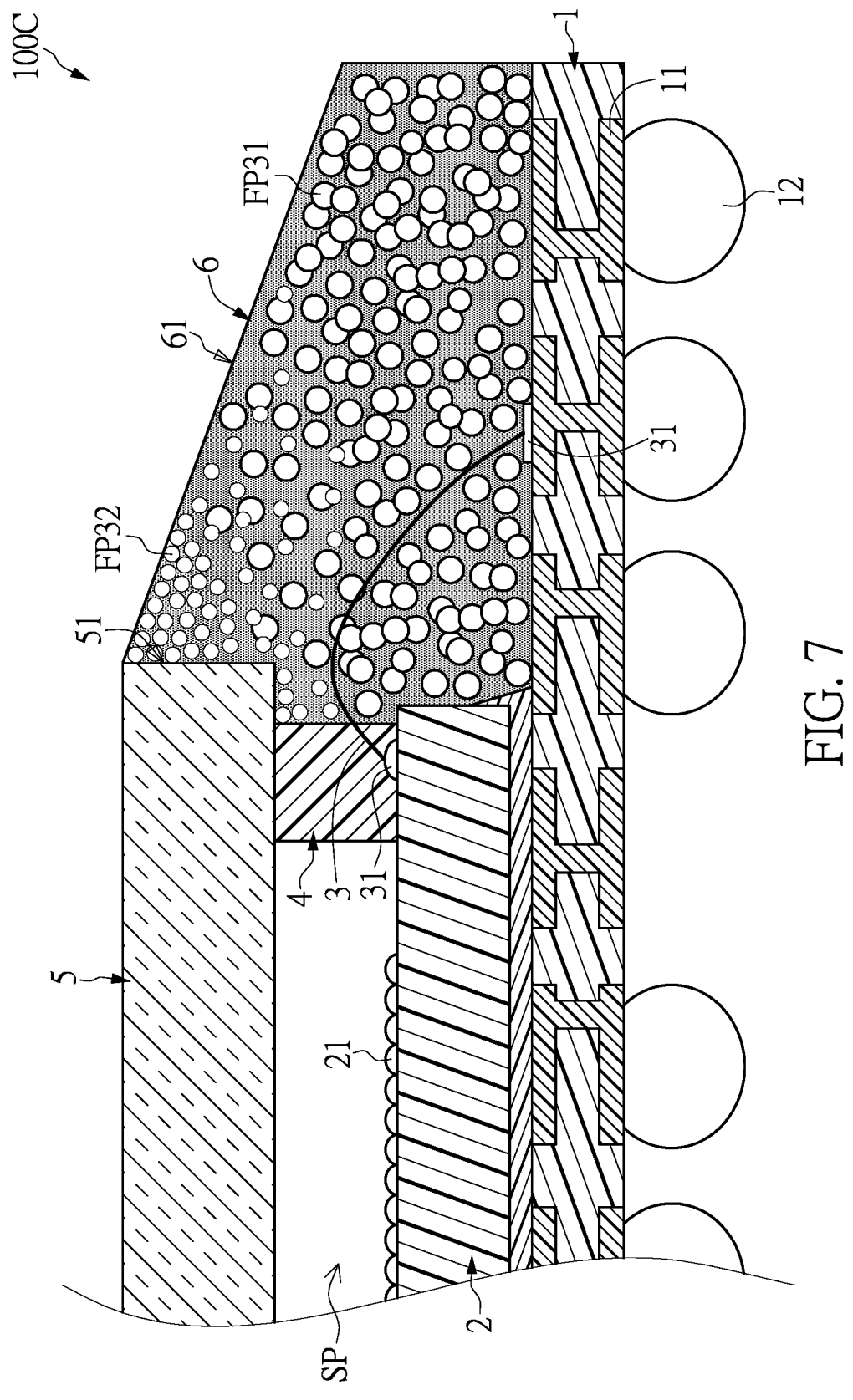
Figure 8:
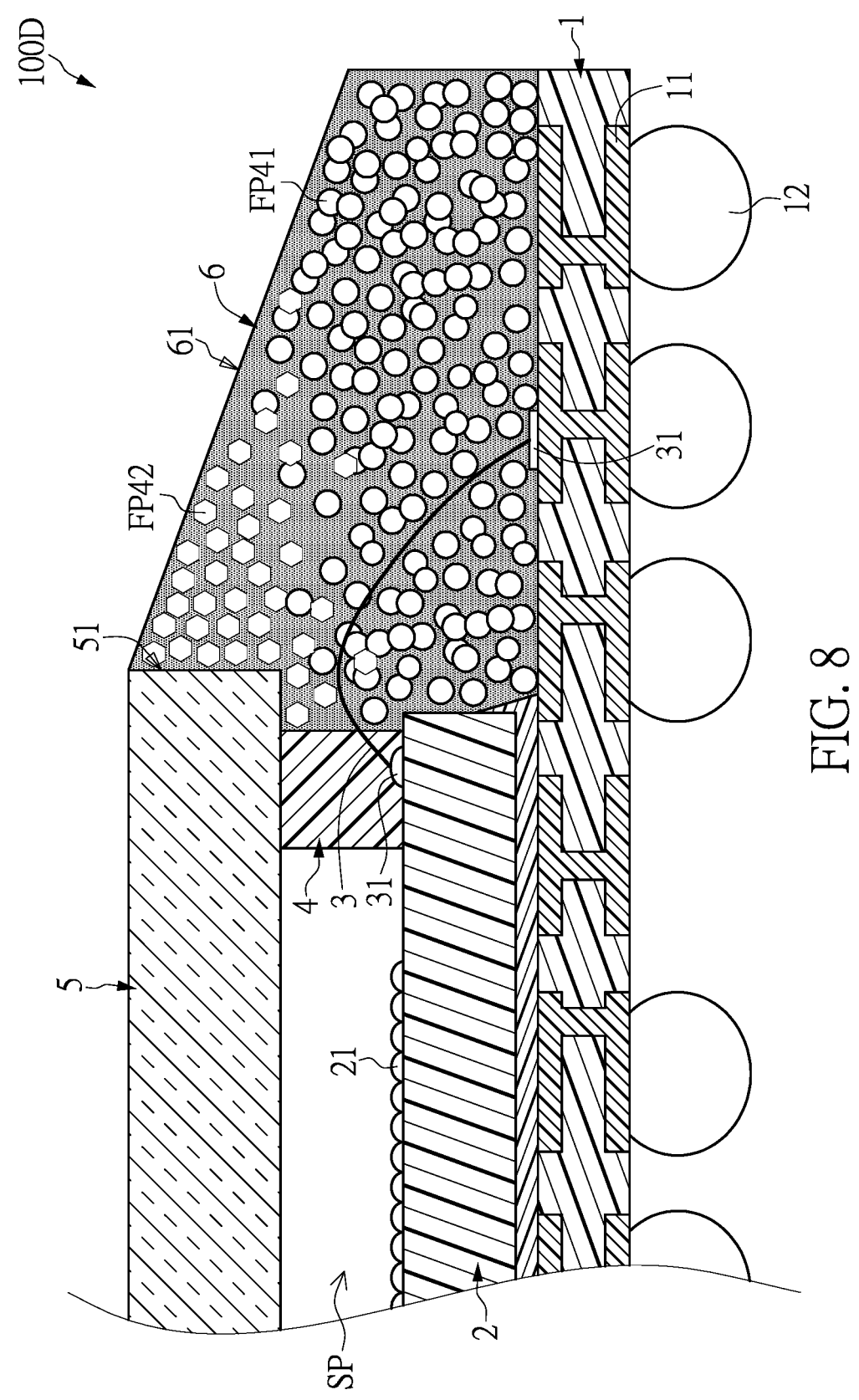
Figure 9:
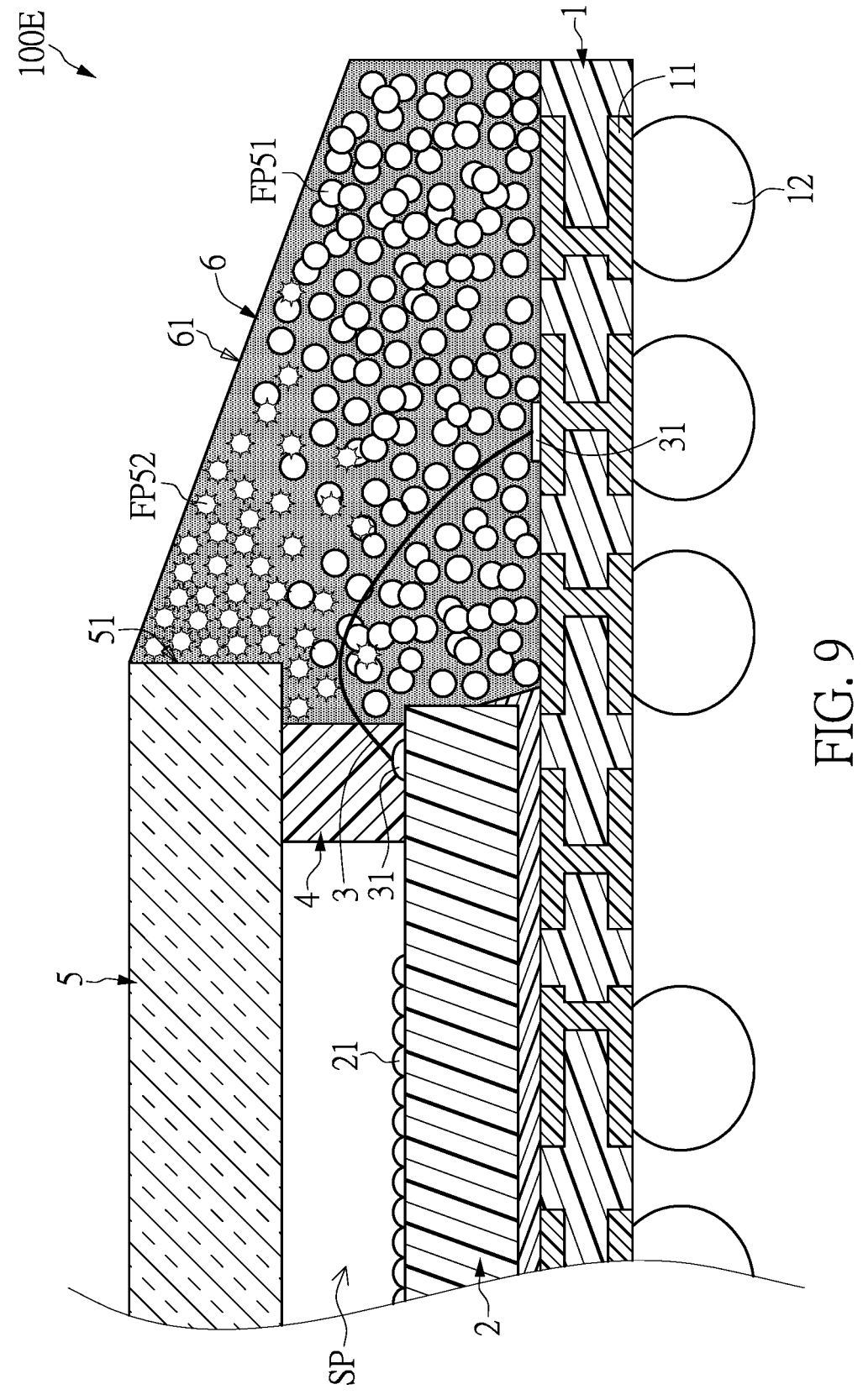
Figure 10:
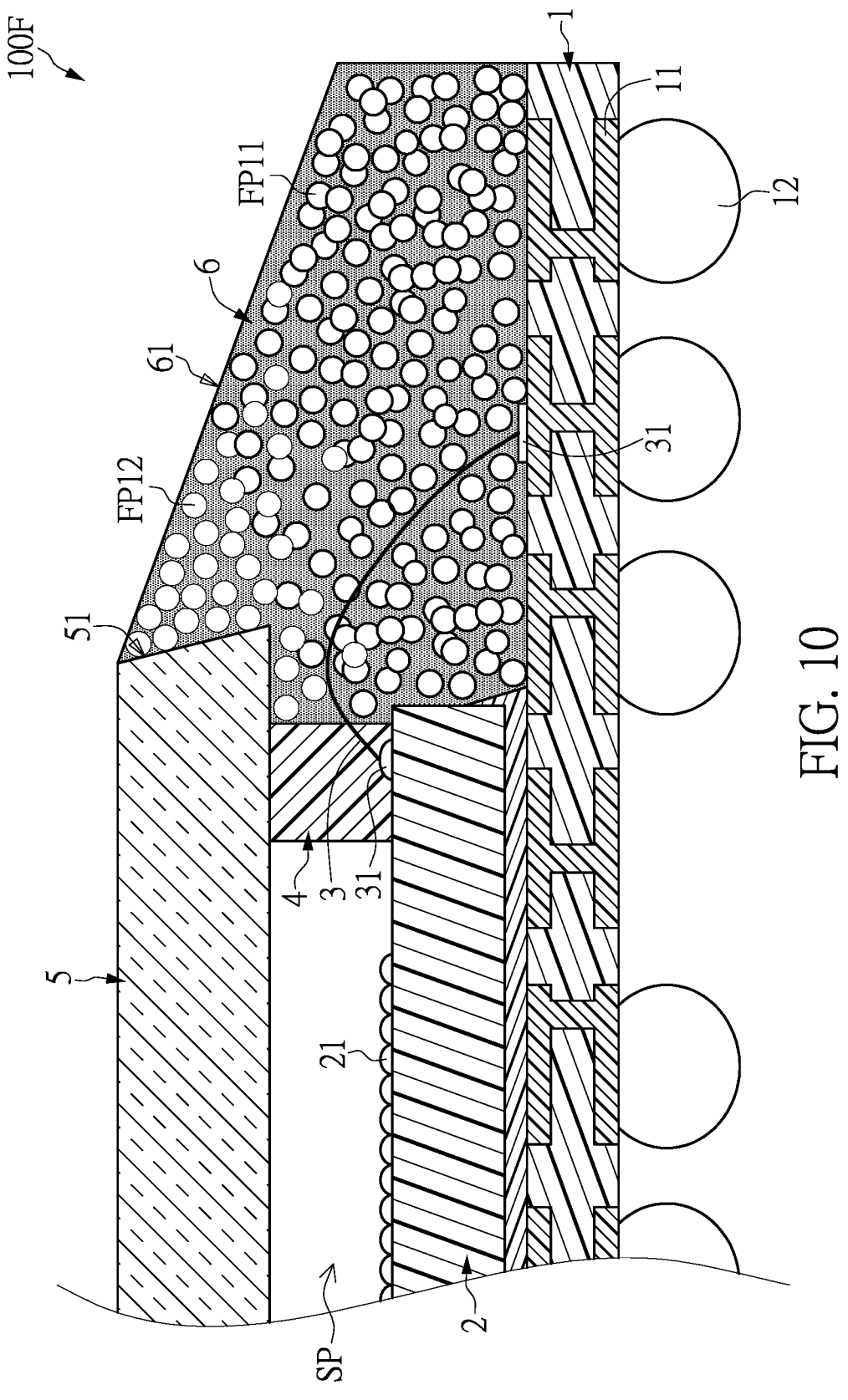
Figure 11A:
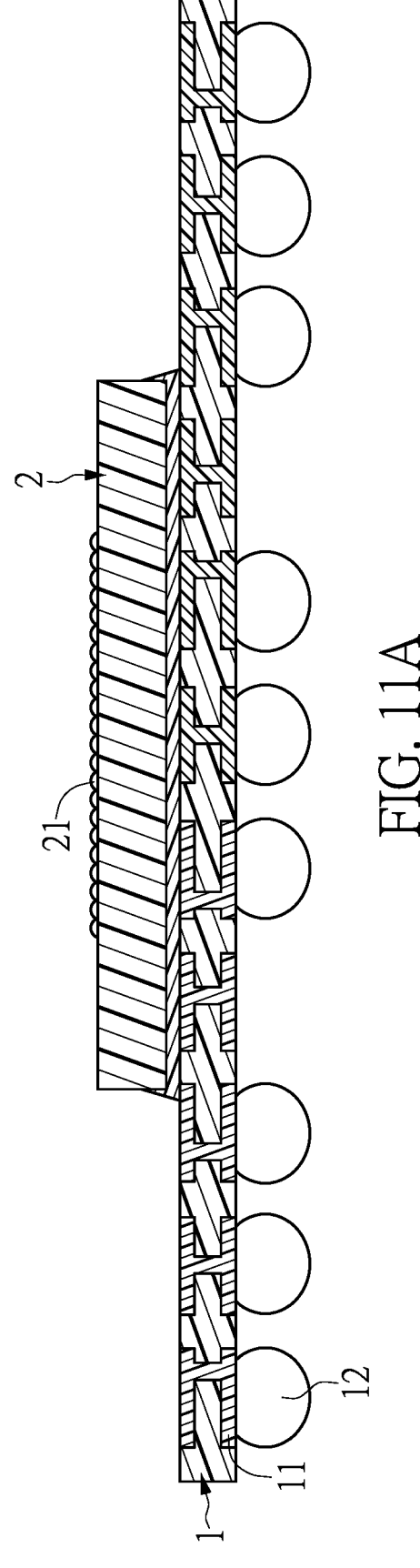
Figure 11B:
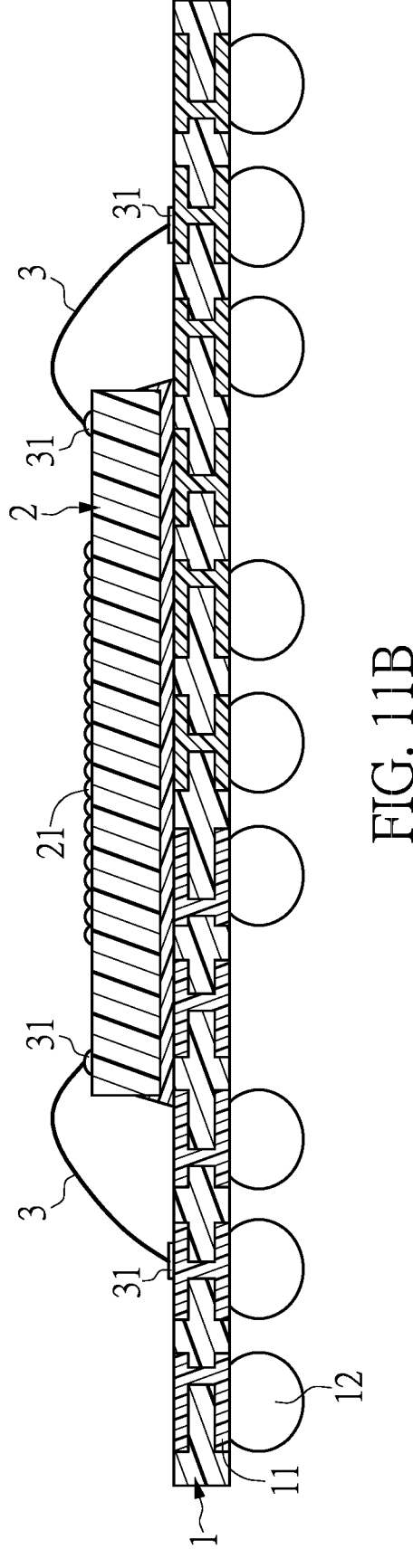
Figure 11C:
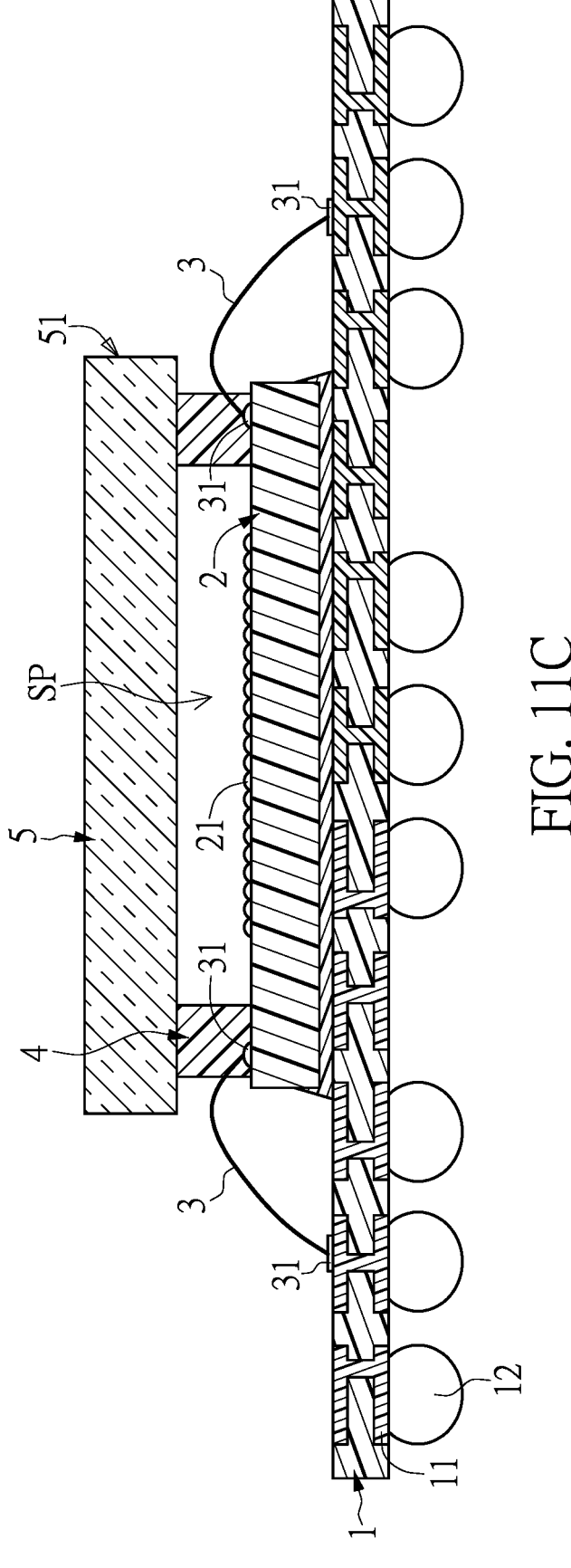
Figure 11D:
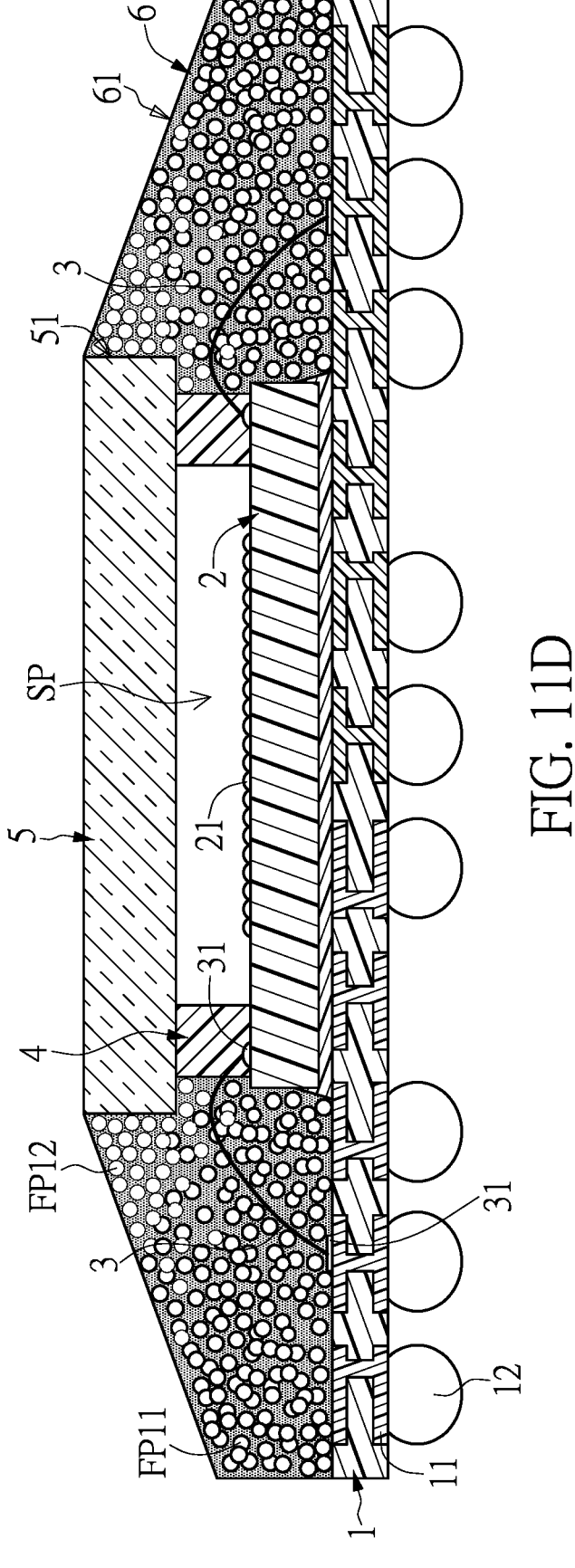

FIG. 1 is a cross-sectional view of a conventional semi-conductor package structure;

FIG. 2 is a partial enlarged view of a region II in FIG. 1;

FIG. 3 is a schematic view showing a crack occurred on a glass substrate of the semiconductor package structure of FIG. 2;

FIG. 4 is a cross-sectional view of a semiconductor package structure according to a first embodiment of the present disclosure;

FIG. 5 is a partial enlarged view of the semiconductor package structure of FIG. 4;

FIG. 6 is a cross-sectional view of a semiconductor package structure according to a second embodiment of the present disclosure;

FIG. 7 is a cross-sectional view of a semiconductor package structure according to a third embodiment of the present disclosure;

FIG. 8 is a cross-sectional view of a semiconductor package structure according to a fourth embodiment of the present disclosure;

FIG. 9 is a cross-sectional view of a semiconductor package structure according to a fifth embodiment of the present disclosure;

FIG. 10 is a cross-sectional view of a semiconductor package structure according to a sixth embodiment of the present disclosure;

FIG. 11A is a schematic view of step S110 of a method for producing a semiconductor package structure according to an embodiment of the present disclosure;

FIG. 11B is a schematic view of step S120 of the method for producing the semiconductor package structure according to the embodiment of the present disclosure;

FIG. 11C is a schematic view of step S130 of the method for producing the semiconductor package structure according to the embodiment of the present disclosure; and FIG. 11D is a schematic view of step S140 of the method for producing the semiconductor package structure according to the embodiment of the present disclosure.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 4 and FIG. 5, a first embodiment of the present disclosure provides a semiconductor package structure 100A, which can be, for example, a semiconductor package structure for a complementary metal oxide semiconductor (CMOS) image sensor (e.g., a CIS packaging structure), but the present disclosure is not limited thereto.

The semiconductor package structure 100A of the embodiment of the present disclosure can effectively improve the technical problem of glass breakage caused by filler separation.

Furthermore, the semiconductor package structure 100A includes a support substrate 1, a chip body 2, a plurality of metal leads 3, a spacer element 4, a light-transmitting plate 5, and an encapsulation colloid 6.

The support substrate 1 can be, for example, a plastic substrate or a ceramic substrate, and the support substrate 1 can be formed with a circuit pattern 11.

The chip body 2 is disposed on a side surface of the support substrate 1 (e.g., an upper surface of the support substrate 1 as shown in FIG. 4). Further, the semiconductor package structure 100A can include a plurality of conductive pins 12 disposed on another side surface of the support substrate 1 (e.g., a lower surface of the support substrate 1 shown in FIG. 4).

In addition, the semiconductor package structure 100A further includes at least one sensing chip 21 (e.g., a CMOS sensing chip) disposed on a side surface of the chip body 2 away from the support substrate 1. The plurality of conductive pins 12 are electrically connected to the circuit pattern 11 and the sensing chip 21 to transmit electronic signals to an external device.

Two connecting portions 31 at both ends of each of the metal leads 3 are respectively connected to the support substrate 1 and the chip body 2. Accordingly, the support substrate 1 and the chip body 2 can be electrically connected to each other through the plurality of metal leads 3.

In some embodiments of the present disclosure, each of the metal leads 3 can be, for example, a gold wire, a copper wire, a conductive wire formed by mixing gold and palladium, or a conductive wire formed by mixing gold and other trace metals.

The spacer element 4 can be, for example, in an annular shape (e.g., a square annular shape or a circular annular shape).

The spacer element 4 is disposed on a side surface of the chip body 2 away from the support substrate 1, and the spacer element 4 is disposed to surround the sensing chip 21. A material of the spacer element 4 can be, for example, glass or plastic (e.g., a polyimide resin, an amide resin, an epoxy resin, or a liquid crystal polymer).

The light-transmitting plate 5 is disposed at intervals on the chip body 2 through the spacer element 4. The chip body 2, the spacer element 4, and the light-transmitting plate 5 together form a closed space SP. The sensing chip 21 is located inside the closed space SP, and the metal leads are located outside of the closed space SP.

The light-transmitting plate 5 can be, for example, a light-transmitting glass plate or a light-transmitting plastic plate (e.g., an acrylic resin plate or other light-transmitting plastic plate). Accordingly, a sensing signal from outside can penetrate the light-transmitting plate 5 and be received by the sensing chip 21 located inside the closed space SP.

As shown in FIG. 4 and FIG. 5, the encapsulation colloid 6 is formed on the support substrate 1 to cover outsides of the chip body 2, the spacer element 4, and the light-transmitting plate 5 relative to the closed space SP. Further, the encapsulation colloid 6 covers and encapsulates the plurality of metal lead 2 therein.

The encapsulation colloid 6 can be formed by curing a liquid resin encapsulant. The liquid resin encapsulant can be, for example, at least one of an epoxy resin encapsulant, a silicone resin encapsulant, and a polyurethane resin encapsulant. Furthermore, the liquid resin encapsulant can be, for example, formed on the support substrate 1 by glue dispensing to cover the outer surface(s) defining the closed space SP, but the present disclosure is not limited thereto.

The encapsulation colloid 6 can, for example, fully cover outside walls of the chip body 2, the spacer element 4, and the light-transmitting plate 5, and a top surface of the light-transmitting plate 5 is exposed to an external environment and is not covered by the encapsulation colloid 6.

In the present embodiment, a colloid thickness of the encapsulation colloid 6 on the support substrate 1 gradually decreases from a direction close to and away from the chip body 2, the spacer element 4, and the light-transmitting plate 5. From another perspective, a colloid surface 61 of the encapsulation colloid 6 is a flat inclined surface that slopes downward toward an outside (i.e., an external environment) from a connection point with the light-transmitting plate 5, but the present disclosure is not limited thereto. The colloid surface 61 of the encapsulation colloid 6 can also be, for example, a concave curved surface that slopes downward toward the outside.

In the present embodiment, the encapsulation colloid 6 fully covers the outside wall 51 of the light-transmitting plate 5, and an angle α between the colloid surface 61 of the encapsulation colloid 6 and the outside wall 51 of the light-transmitting plate 5 is an acute angle, which is an included angle less than 90 degrees, for example, an included angle of 30 to 60 degrees, but the present disclosure is not limited thereto.

Furthermore, the encapsulation colloid 6 includes a plurality of first fillers FP11 and a plurality of second fillers FP12 dispersed therein.

In the present embodiment, material properties of the plurality of first fillers FP11 and the plurality of second fillers FP12 meet following conditions.

Before the liquid resin encapsulant is cured (i.e., the liquid resin encapsulant being in a flowable state), a sinking rate of each of the first fillers FP11 in the liquid resin encapsulant is defined as a first sinking rate, a sinking rate of each of the second fillers FP12 in the liquid resin encapsulant is defined as a second sinking rate, and the second sinking rate of each of the second fillers FP12 is less than the first sinking rate of each of the first fillers FP11.

From another perspective, when the first fillers FP11 and the second fillers FP12 sink in the liquid resin encapsulant, the first fillers FP11 have a lower sinking resistance so as to sink faster than the second fillers FP12. Therefore, each of the first fillers FP11 has the first sinking rate greater than the second sinking rate. Furthermore, when the first fillers FP11 and the second fillers FP12 sink in the liquid resin encapsulant, the second fillers FP12 have a higher sinking resistance so as to sink slower than the first fillers FP11.

Therefore, each of the second fillers FP12 has the second sinking rate less than the first sinking rate.

Accordingly, since the first sinking rate of each of the first fillers FP11 is greater than the second sinking rate of each of the second fillers FP12, the plurality of first fillers FP11 may sink quickly and be mostly distributed in a lower half part 62 of the encapsulation colloid 6, and the plurality of second fillers FP12 may sink slowly and be mostly distributed in an upper half part 63 of the encapsulation colloid 6. A portion of the upper half part 63 of the encapsulation colloid 6 sandwiched by the colloid surface 61 and the outside wall 51 of the light-transmitting plate 5 is defined as a top edge area, and at least part of the plurality of second fillers FP12 is dispersed in the top edge area of the encapsulation colloid 6.

Accordingly, the second fillers FP12 can be at least partially distributed at the highest point of intersection between the encapsulation colloid 6 and the light-transmitting plate 5, so that the problem of glass breakage caused by filler separation can be improved.

In some embodiments of the present disclosure, in the encapsulation colloid 6, at least 65%, preferably at least 70%, and more preferably at least 75% of the plurality of first fillers FP11 are distributed in the lower half part 62 of the encapsulation colloid 6.

In addition, at least 65%, preferably at least 70%, and more preferably at least 75% of the plurality of second fillers FP12 are distributed in the upper half part 63 of the encapsulation colloid 6.

In other words, the plurality of first fillers FP11 and the plurality of second fillers FP12 have different distribution positions due to differences in sinking rates. The plurality of first fillers FP11 and the plurality of second fillers FP12 are not evenly distributed in the encapsulation colloid 6.

A thickness of the encapsulation colloid 6 from the side surface (i.e., the upper surface) of the support substrate 1 to a top edge (i.e., a top surface) of the light-transmitting plate 5 is defined as a maximum thickness Tmax. The lower half part 62 of the encapsulation colloid 6 is defined by a part of the encapsulation colloid 6 covering from the upper surface of the support substrate 1 to half of the maximum thickness Tmax. The upper half part 63 of the encapsulation colloid 6 is defined by a remaining part of the encapsulation colloid 6 located above the lower half part 62, but the present disclosure is not limited thereto.

Furthermore, in the first embodiment of the present disclosure, each of the first fillers FP11 has a first density, each of the second fillers FP12 has a second density, and the first density of each of the first fillers FP11 is greater than the second density of each of the second fillers FP12.

In addition, the first density of each of the first fillers FP11 and the second density of each of the second fillers FP12 are both greater than a density of the liquid resin encapsulant.

Accordingly, since each of the first fillers FP11 has the first density greater than the second density, when the first fillers FP11 sink downward in the liquid resin encapsulant, the first fillers FP11 have less sinking resistance and may sink faster than the second fillers FP12. Therefore, each of the first fillers FP11 has the first sinking rate greater than the second sinking rate.

In other words, since each of the second fillers FP12 has the second density less than the first density, when the second fillers FP12 sink downward in the liquid resin encapsulant, the second fillers FP12 have larger sinking resistance and may sink slower than the first fillers FP11. Therefore, each of the second fillers FP12 has the second sinking rate less than the first sinking rate.

In some embodiments of the present disclosure, the first density of each of the first fillers FP11 can be, for example, between 3 g/cm³ and 10 g/cm³, and preferably between 3 g/cm³ and 7 g/cm³. The second density of each of the second fillers FP12 can be, for example, between 1 g/cm³ and 3 g/cm³, and preferably between 2 g/cm³ and 3 g/cm³. Furthermore, an absolute value of a difference between the first density of each of the first fillers FP11 and the second density of each of the second fillers FP12 is not less than 1 g/cm³, but the present disclosure is not limited thereto.

In some embodiments of the present disclosure, each of the first fillers FP11 can be selected from the group consisting of: silicon dioxide particles, silicon carbide particles, silicon nitride particles, rubber particles, and composite particles composed of metal and rubber. Each of the second fillers FP12 can be selected from the group consisting of: silicon dioxide particles, silicon carbide particles, silicon nitride particles, rubber particles, and composite particles composed of metal and rubber.

It should be noted that the material of each of the first fillers FP11 and the material of each of the second fillers FP12 can be the same as each other or different from each other, and the present disclosure is not limited thereto.

A particle size (e.g., an average particle size D50) of each of the first fillers FP11 can be, for example, between 5 micrometers and 50 micrometers, and preferably between 5 micrometers and 20 micrometers. In addition, a particle size of each of the second fillers FP12 can be, for example, between 5 micrometers and 35 micrometers, and preferably between 5 micrometers and 15 micrometers. It should be noted that the particle size of each of the first fillers FP11 and the particle size of each of the second fillers FP12 can be the same as each other or different from each other, and the present disclosure is not limited thereto.

In some embodiments of the present disclosure, based on a total weight of the encapsulation colloid 6 being 100 wt %, a first weight percentage concentration of the plurality of first fillers FP11 in the encapsulation colloid 6 is between 5 wt % and 15 wt %, and preferably between 5 wt % and 10 wt %.

In addition, a second weight percentage concentration of the plurality of second fillers FP12 in the encapsulation colloid 6 is between 5 wt % and 15 wt %, and preferably between 5 wt % and 10 wt %. However, the present disclosure is not limited thereto.

Furthermore, in some embodiments of the present disclosure, the maximum thickness Tmax defined by the thickness of the encapsulation colloid 6 from the upper surface of the support substrate 1 to the top edge of the light-transmitting plate 5 can be, for example, between 650 micrometers and 1,600 micrometers, and preferably between 650 micrometers and 1,000 micrometers.

In addition, the angle α included by the colloid surface 61 of the encapsulation colloid 6 and the outside wall 51 of the light-transmitting plate 5 is an acute angle as shown in FIG. 5, and the acute angle is an included angle less than 90 degrees (e.g., an included angle between 30 degrees and 60 degrees).

According to the above configuration, through the design of the material properties of the first fillers FP11 and the second fillers FP12 in the encapsulation colloid 6, the semiconductor package structure 100A of the first embodiment of the present disclosure has an improved filler distribution so as to avoid glass cracks caused by filler separation.

Second Embodiment

Referring to FIG. 6, a second embodiment of the present disclosure provides a semiconductor package structure 100B, which is substantially the same as the semiconductor package structure 100A of the above-mentioned first embodiment, except for the size design of the fillers.

More specifically, the encapsulation colloid 6 of the semiconductor package structure 100B of the second embodiment of the present disclosure includes a plurality of first fillers FP21 and a plurality of second fillers FP22 dispersed therein. Each of the first fillers FP21 has a first density, each of the second fillers FP22 has a second density, and the first density of each of the first fillers FP21 is greater than the second density of each of the second fillers FP22. Furthermore, the first density of each of the first fillers FP21 and the second density of each of the second fillers FP22 are both greater than the density of the liquid resin encapsulant.

Furthermore, each of the first fillers FP21 has a first particle size, and each of the second fillers FP22 has a second particle size. The first particle size of each of the first fillers FP21 is smaller than the second particle size of each of the second fillers FP22. As shown in FIG. 6, each of the first fillers FP21 distributed in the lower half part of the encapsulation colloid 6 has a smaller particle size, and each of the second fillers FP22 distributed in the upper half part of the encapsulation colloid 6 has a larger particle size.

In the present embodiment, the first fillers FP21 have less sinking resistance when sinking downward in the liquid resin encapsulant, and the first fillers FP21 may sink faster than the second fillers FP22. Therefore, each of the first fillers FP21 has the first sinking rate greater than the second sinking rate. In other words, the second fillers FP22 have larger sinking resistance when sinking downward in the liquid resin encapsulant, and the second fillers FP22 may sink slower than the first fillers FP21. Therefore, each of the second fillers FP22 has the second sinking rate less than the first sinking rate.

According to the above configuration, through the design of the material properties of the first fillers FP21 and the second fillers FP22 in the encapsulation colloid 6, the semiconductor package structure 100B of the second embodiment of the present disclosure has an improved filler distribution so as to avoid glass cracks caused by filler separation.

Third Embodiment

Referring to FIG. 7, a third embodiment of the present disclosure provides a semiconductor package structure 100C, which is substantially the same as the semiconductor package structure 100A of the above-mentioned first embodiment, except for the size design of the fillers.

More specifically, the encapsulation colloid 6 of the semiconductor package structure 100C of the third embodiment of the present disclosure includes a plurality of first fillers FP31 and a plurality of second fillers FP32 dispersed therein.

Each of the first fillers FP31 has a first density, each of the second fillers FP32 has a second density, and the first density of each of the first fillers FP31 is greater than the second density of each of the second fillers FP32. Furthermore, the first density of each of the first fillers FP31 and the second density of each of the second fillers FP32 are both greater than the density of the liquid resin encapsulant.

Furthermore, each of the first fillers FP31 has a first particle size, and each of the second fillers FP32 has a second particle size. The first particle size of each of the first fillers FP31 is larger than the second particle size of each of the second fillers FP32. As shown in FIG. 7, each of the first fillers FP31 distributed in the lower half part of the encapsulation colloid 6 has a larger particle size, and each of the second fillers FP32 distributed in the upper half part of the encapsulation colloid 6 has a smaller particle size.

In the present embodiment, the first fillers FP31 have less sinking resistance when sinking downward in the liquid resin encapsulant, and the first fillers FP31 may sink faster than the second fillers FP32. Therefore, each of the first fillers FP31 has the first sinking rate greater than the second sinking rate. In other words, the second fillers FP32 have larger sinking resistance when sinking downward in the liquid resin encapsulant, and the second fillers FP32 may sink slower than the first fillers FP31. Therefore, each of the second fillers FP32 has the second sinking rate less than the first sinking rate.

According to the above configuration, through the design of the material properties of the first fillers FP31 and the second fillers FP32 in the encapsulation colloid 6, the semiconductor package structure 100C of the third embodiment of the present disclosure has an improved filler distribution so as to avoid glass cracks caused by filler separation.

Fourth Embodiment

Referring to FIG. 8, a fourth embodiment of the present disclosure provides a semiconductor package structure 100D, which is substantially the same as the semiconductor package structure 100A of the above-mentioned first embodiment, and a difference of the semiconductor package structure 100D of the fourth embodiment resides in appearances of the first and second fillers. More specifically, the encapsulation colloid 6 of the semiconductor package structure 100D of the fourth embodiment includes a plurality of first fillers FP41 and a plurality of second fillers FP42 dispersed therein.

Each of the first fillers FP41 has a spherical appearance that has a first sphericity. Each of the second fillers FP42 has a non-spherical appearance (e.g., a polygonal appearance) that has a second sphericity. The first sphericity of each of the first fillers FP41 is greater than the second sphericity of each of the second fillers FP42.

It should be noted that the "sphericity" referred to in the present embodiment can be defined as "a ratio of the minimum particle diameter to the maximum particle diameter of a same particle." For example, according to an observation result of a scanning electron microscope (SEM), a ratio of the minimum particle diameter to the maximum particle diameter of a particle is not less than 0.8, which means that the sphericity of the particle is not less than 0.8. If the "sphericity" of the particle approaches 1, the particle approaches a perfect sphere. In an embodiment, the "sphericity" can be an average sphericity.

As shown in FIG. 8, each of the first fillers FP41 distributed in the lower half part of the encapsulation colloid 6 has an appearance closer to a sphere, so as to have the first sphericity higher than the second sphericity.

From another perspective, each of the second fillers FP42 distributed in the upper half part of the encapsulation colloid 6 has a polygonal appearance, so as to have the second sphericity lower than the first sphericity.

In the present embodiment, since each of the first fillers FP41 has a relatively high first sphericity, the first fillers FP41 have less sinking resistance when sinking downward in the liquid resin encapsulant. That is, a contact area of each of the first fillers FP41 contacting the liquid resin encapsulant is small. Accordingly, the first fillers FP41 can sink faster than the second fillers FP42, so as to have a relatively large first sinking rate.

Furthermore, since each of the second fillers FP42 has a relatively low second sphericity, the second fillers FP42 have larger sinking resistance when sinking downward in the liquid resin encapsulant. That is, a contact area of each of the second fillers FP42 contacting the liquid resin encapsulant is large. Accordingly, the second fillers FP42 can sink slower than the first fillers FP41 so as to have a relatively low second sinking rate.

In some embodiments, the first sphericity of each of the first fillers FP41 is between 0.6 and 1.0. The second sphericity of each of the second fillers FP42 is between 0.4 and 0.8. An absolute value of a difference between the first sphericity and the second sphericity is not less than 0.05, and is preferably not less than 0.1, but the present disclosure is not limited thereto.

According to the above configuration, through the designs of appearances and sphericities of the first fillers FP41 and the second fillers FP42 in the encapsulation colloid 6, the semiconductor package structure 100D of the fourth embodiment of the present disclosure has an improved filler distribution so as to avoid glass cracks caused by filler separation.

It is worth mentioning that, in the fourth embodiment of the present disclosure, the density of each of the first fillers FP41 and the density of each of the second fillers FP42 can be the same as or different from each other. Further, the particle size of each of the first fillers FP41 and the particle size of each of the second fillers FP42 can be the same as or different from each other, and the present disclosure is not limited thereto.

As long as the designs of appearances and sphericities of the first fillers FP41 and the second fillers FP42 enable each of the first fillers FP41 to have a relatively large first sinking rate in the liquid resin encapsulant, and enable each of the second fillers FP42 to have a small second sinking rate relative to the first fillers FP41 in the liquid resin encapsulant, the designs of appearances and sphericities fall under the spirit and scope of the present disclosure.

Fifth Embodiment

Referring to FIG. 9, a fifth embodiment of the present disclosure provides a semiconductor package structure 100E, which is substantially the same as the semiconductor package structure 100A of the above-mentioned first embodiment, and the difference of the semiconductor package structure 100E of the fifth embodiment is the surface roughnesses of the first and second fillers. More specifically, the encapsulation colloid 6 of the semiconductor package structure 100E of the fifth embodiment of the present disclosure includes a plurality of first fillers FP51 and a plurality of second fillers FP52 dispersed therein.

An outer surface of each of the first fillers FP51 has a first surface roughness, an outer surface of each of the second fillers FP52 has a second surface roughness, and the first surface roughness of each of the first fillers FP51 is less than the second surface roughness of each of the second fillers FP52.

That is, each of the first fillers FP51 has a smooth surface, and each of the second fillers FP52 has a rough surface.

As shown in FIG. 9, each of the first fillers FP51 distributed in the lower half part of the encapsulation colloid 6 has a smoother surface than that of each of the second fillers FP52, so as to have the first surface roughness that is less than the second surface roughness. In other words, each of the second fillers FP52 distributed in the upper half part of the encapsulation colloid 6 has a rougher surface than that of the first fillers FP51, so as to have the second surface roughness that is greater than the first surface roughness.

In the present embodiment, since each of the first fillers FP51 has a relatively low first surface roughness, the first fillers FP51 have less sinking resistance when sinking downward in the liquid resin encapsulant. That is, the outer surface of each of the first fillers FP51 is smooth and has less resistance to contact with the liquid resin encapsulant. Accordingly, the first fillers FP51 can sink faster than the second fillers FP52, so as to have the first sinking rate that is greater than the second sinking rate. Furthermore, since each of the second fillers FP52 has a relatively large second surface roughness, the second fillers FP52 have larger sinking resistance when sinking downward in the liquid resin encapsulant. That is, the outer surface of each of the second fillers FP52 is rough and has higher resistance when coming in contact with the liquid resin encapsulant. Accordingly, the second fillers FP52 can sink slower than the first fillers FP51 so as to have the second sinking rate that is less than the first sinking rate.

In some embodiments of the present disclosure, the first surface roughness and the second surface roughness are both defined by arithmetic mean roughness Ra, and the arithmetic mean roughness Ra can be measured, for example, by an atomic force microscope (AFM), and Ra is calculated based on the international standard test method of JIS B 0601, but the present disclosure is not limited thereto.

Further, in some embodiments of the present disclosure, the first surface roughness of each of the first fillers FP51 is between 25 nm and 100 nm, and preferably between 25 nm and 75 nm. In addition, the second surface roughness of each of the second fillers FP52 is between 50 nm and 125 nm, and preferably between 75 nm and 125 nm.

Furthermore, an absolute value of a difference between the first surface roughness and the second surface roughness is not less than 25 nm, but the present disclosure is not limited thereto.

According to the above configuration, through the designs of surface roughnesses of the first fillers FP51 and the second fillers FP52 in the encapsulation colloid 6, the semiconductor package structure 100E of the fifth embodiment of the present disclosure has an improved filler distribution so as to avoid glass cracks caused by filler separation.

It is worth mentioning that, in the fifth embodiment of the present disclosure, the density of each of the first fillers FP51 and the density of each of the second fillers FP52 can be the same as or different from each other. Further, the particle size of each of the first fillers FP51 and the particle size of each of the second fillers FP5 can be the same as or different from each other, and the present disclosure is not limited thereto.

As long as the designs of surface roughnesses of the first fillers FP51 and the second fillers FP52 enable each of the first fillers FP51 to have a relatively large first sinking rate in the liquid resin encapsulant, and enable each of the second fillers FP52 to have a relatively small second sinking rate in the liquid resin encapsulant, the designs of appearances and sphericities fall under the spirit and scope of the present disclosure.

Sixth Embodiment

Referring to FIG. 10, a sixth embodiment of the present disclosure provides a semiconductor package structure 100F, which is substantially the same as the semiconductor package structure 100A of the above-mentioned first embodiment, and the difference of the semiconductor package structure 100F of the sixth embodiment resides in the design of the light-transmitting plate 5.

More specifically, in the semiconductor package structure 100F of the sixth embodiment, a width of the light-transmitting plate 5 gradually increases from a top surface to a bottom surface of the light-transmitting plate 5. That is, the light-transmitting plate 5 has a shape that is narrow at the top and wide at the bottom thereof. From a side view, the light-transmitting plate 5 has a trapezoidal shape, and the outside wall 51 of the light-transmitting plate 5 is a downward sloping side wall.

Accordingly, in the upper half part of the encapsulation colloid 6, the top edge area defined by the portion sandwiched by the colloid surface 61 of the encapsulation colloid 6 and the outside wall 51 of the light-transmitting plate 5 becomes smaller in space. Accordingly, the fillers (i.e., the second fillers FP12) dispersed in the top edge area of the encapsulation colloid 6 can sink less easily and be filled in the top edge area more completely.

According to the above configuration, through the design of the light-transmitting plate 5 being narrow at top and wide at bottom, the semiconductor package structure 100F of the sixth embodiment of the present disclosure has an improved filler distribution so as to avoid glass cracks caused by filler separation.

[Method for Producing Semiconductor Package Structure]

The structural and material characteristics of the semiconductor package structures of the first to sixth embodiments are described above, and a method for producing a semiconductor package structure according to an embodiment of the present disclosure is described in detail below.

As shown in FIG. 11A to FIG. 11D, an embodiment of the present disclosure provides a method for producing a semiconductor package structure, which includes step S110, step S120, step S130, and step S140. It should be noted that a sequence of the steps and actual ways of operation in the present embodiment can be adjusted according to practical requirements, and are not limited to those described in the present embodiment.

As shown in FIG. 11A, step S110 includes: providing a support substrate 1 and disposing a chip body 2 on a side surface (i.e., an upper surface) of the support substrate 1.

The support substrate 1 can be formed with a circuit pattern 11. Another side surface (i.e. a lower surface) of the support substrate 1 can be provided with a plurality of conductive pins 12. Further, a side surface of the chip body 2 away from the support substrate 1 can be provided with at least one sensing chip 21. The plurality of conductive pins 12 are electrically connected to the circuit pattern 11 and the sensing chip 21.

As shown in FIG. 11B, step S120 includes: connecting a plurality of metal leads 3 between the support substrate 1 and the chip body 2 respectively, so that the support substrate 1 and the chip body 2 can be electrically connected to each other through the plurality of metal leads 3.

As shown in FIG. 11C, step S130 includes disposing a light-transmitting plate 5 on the chip body 2 through a spacer element 4, so that the chip body 2, the spacer element 4, and the light-transmitting plate 5 together form a closed space SP. The sensing chip 21 is located in the closed space SP, and the metal leads 3 are located outside of the closed space SP.

As shown in FIG. 11D, step S140 includes forming an encapsulation colloid 6 on the support substrate 1 to cover the outside surfaces of the chip body 2, the spacer element 4, and the light-transmitting plate 5 relative to the closed space SP, and the encapsulation colloid 6 covers the plurality of metal leads 3 therein.

In the present embodiment, the encapsulation colloid 6 can be formed by curing a liquid resin encapsulant. Furthermore, the liquid resin encapsulant can be, for example, formed on the support substrate 1 by glue dispensing to cover the outside surfaces of the chip body 2, the spacer element 4, and the light-transmitting plate 5 relative to the closed space SP.

The encapsulation colloid 6 includes a plurality of first fillers FP11 and a plurality of second fillers FP12 dispersed therein.

Furthermore, material properties of the plurality of first fillers FP11 and the plurality of second fillers FP12 meet following conditions.

Before the liquid resin encapsulant is cured (being in a flowable state), a sinking rate of each of the first fillers FP11 in the liquid resin encapsulant is defined as a first sinking rate, a sinking rate of each of the second fillers FP12 in the liquid resin encapsulant is defined as a second sinking rate, and the second sinking rate is less than the first sinking rate.

From another perspective, when the first fillers FP11 and the second fillers FP12 sink in the liquid resin encapsulant, the first fillers FP11 have a lower sinking resistance so as to sink faster than the second fillers FP12. Therefore, each of the first fillers FP11 has the first sinking rate greater than the second sinking rate. In other words, the second fillers FP12 have a higher sinking resistance so as to sink slower than the first fillers FP11. Therefore, each of the second fillers FP12 has the second sinking rate less than the first sinking rate.

According to the above configuration, through the design of the material properties of the first fillers FP11 and the second fillers FP12 in the encapsulation colloid 6, the method for producing the semiconductor package structure can have an improved filler distribution so as to avoid glass cracks caused by filler separation.

Beneficial Effects of the Embodiments

In conclusion, in the semiconductor package structure and the method for producing the same provided by the present disclosure, through the design of material properties of the first fillers and the second fillers in the encapsulation colloid, the distribution of the first fillers and the second fillers in the encapsulation colloid can be effectively improved, and the glass cracks caused by the filler separation can be effectively avoided.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:
1. A semiconductor package structure, comprising:
a support substrate;
a chip body disposed on a side surface of the support substrate;
a metal lead connected between the support substrate and the chip body;

a spacer element disposed on a side surface of the chip body;
a light-transmitting plate disposed on the chip body through the spacer element; wherein the chip body, the spacer element, and the light-transmitting plate jointly define a closed space; and
an encapsulation colloid formed on the support substrate to cover outsides of the chip body, the spacer element, and the light-transmitting plate relative to the closed space, and to cover the metal lead;
wherein the encapsulation colloid is formed by curing a liquid resin encapsulant, and the encapsulation colloid includes a plurality of first fillers and a plurality of second fillers dispersed therein;
wherein material properties of the plurality of first fillers and the plurality of second fillers meet following conditions:
before the liquid resin encapsulant is cured, a sinking rate of each of the first fillers in the liquid resin encapsulant is defined as a first sinking rate, a sinking rate of each of the second fillers in the liquid resin encapsulant is defined as a second sinking rate, and the second sinking rate is less than the first sinking rate.

2. The semiconductor package structure according to claim 1, further comprising: a sensing chip disposed on a side surface of the chip body away from the support substrate; wherein the sensing chip is located inside the closed space, and the metal lead is located outside the closed space.

3. The semiconductor package structure according to claim 1, wherein, in an upper half part of the encapsulation colloid, a portion sandwiched by a colloid surface of the encapsulation colloid and an outside wall of the light-transmitting plate is defined as a top edge area, and at least part of the plurality of the second fillers are dispersed in the top edge area of the encapsulation colloid.

4. The semiconductor package structure according to claim 1, wherein, in the encapsulation colloid, at least 65% of the first fillers are distributed in a lower half part of the encapsulation colloid, and at least 65% of the second fillers are distributed in an upper half part of the encapsulation colloid.

5. The semiconductor package structure according to claim 1, wherein each of the first fillers has a first density, each of the second fillers has a second density, and the first density of each of the first fillers is greater than the second density of each of the second fillers.

6. The semiconductor package structure according to claim 1, wherein each of the first fillers has a spherical appearance that has a first sphericity, each of the second fillers has a non-spherical appearance that has a second sphericity, and the first sphericity of each of the first fillers is greater than the second sphericity of each of the second fillers.

7. The semiconductor package structure according to claim 1, wherein an outer surface of each of the first fillers has a first surface roughness, an outer surface of each of the second fillers has a second surface roughness, and the first surface roughness of each of the first fillers is less than the second surface roughness of each of the second fillers.

8. The semiconductor package structure according to claim 3, wherein a width of the light-transmitting plate gradually increases from a top surface to a bottom surface of the light-transmitting plate, the outside wall of the light-transmitting plate is a downward sloping side wall, such that, in the upper half part of the encapsulation colloid, the top edge area defined by the portion sandwiched by the colloid surface of the encapsulation colloid and the outside wall of the light-transmitting plate becomes smaller in space.

9. A method for producing a semiconductor package structure, comprising:

providing a support substrate;

disposing a chip body on a side surface of the support substrate;

connecting a metal lead between the support substrate and the chip body;

disposing a light-transmitting plate on the chip body through a spacer element; wherein the chip body, the spacer element, and the light-transmitting plate jointly define a closed space; and forming an encapsulation colloid on the support substrate to cover outsides of the chip body, the spacer element, and the light-transmitting plate relative to the closed space; wherein the encapsulation colloid covers the metal lead therein;

wherein the encapsulation colloid is formed by curing a liquid resin encapsulant, and the encapsulation colloid includes a plurality of first fillers and a plurality of second fillers dispersed therein;

wherein material properties of the plurality of first fillers and the plurality of second fillers meet following conditions:

before the liquid resin encapsulant is cured, a sinking rate of each of the first fillers in the liquid resin encapsulant is defined as a first sinking rate, a sinking rate of each of the second fillers in the liquid resin encapsulant is defined as a second sinking rate, and the second sinking rate is less than the first sinking rate.

10. The method for producing the semiconductor package structure according to claim 9, wherein, in an upper half part of the encapsulation colloid, a portion sandwiched by a colloid surface of the encapsulation colloid and an outside wall of the light-transmitting plate is defined as a top edge area, and at least part of the plurality of the second fillers are dispersed in the top edge area of the encapsulation colloid.

\* \* \* \* \*